(12) United States Patent
Ma

(10) Patent No.: US 8,246,362 B2
(45) Date of Patent: Aug. 21, 2012

(54) COMPUTER PERIPHERAL DEVICE WITH A PIN EXERTING A FORCE TO EXTEND OR RETRACT A CONNECTOR

(75) Inventor: Tien-Chi Ma, Taipei (TW)

(73) Assignee: PNY Technologies, Inc., Parsippany, NJ (US)

( * ) Notice: Subject to any disclaimer, the term of this patent is extended or adjusted under 35 U.S.C. 154(b) by 265 days.

(21) Appl. No.: 12/788,452

(22) Filed: May 27, 2010

(65) Prior Publication Data
US 2010/0304586 A1  Dec. 2, 2010

(30) Foreign Application Priority Data

May 27, 2009  (TW) .............................. 98209389 U
Jun. 1, 2009  (CN) ...................... 2009 2 0156532 U

(51) Int. Cl.
  *H01R 13/44*  (2006.01)
  *H05K 5/04*  (2006.01)
(52) U.S. Cl. ....................................... 439/131; 361/752
(58) Field of Classification Search .................. 439/131, 439/135, 136, 140; 361/752, 737
  See application file for complete search history.

(56) References Cited

U.S. PATENT DOCUMENTS

| | | |
|---|---|---|
| D556,751 S | 12/2007 | Rambosek et al. |
| D580,434 S | 11/2008 | Kim |
| D581,926 S | 12/2008 | Kim |
| 7,466,556 B2 | 12/2008 | Hiew et al. |
| 7,473,112 B2 | 1/2009 | Zhu et al. |
| 7,524,198 B2 * | 4/2009 | Nguyen et al. ................ 439/131 |
| 7,535,719 B2 * | 5/2009 | Hiew et al. ..................... 361/737 |
| D594,871 S | 6/2009 | Ma |
| 7,558,069 B2 * | 7/2009 | Chung .......................... 361/737 |
| 7,558,070 B2 * | 7/2009 | Kang ............................ 361/752 |
| D602,026 S | 10/2009 | Lo |
| D606,078 S | 12/2009 | Chen |

(Continued)

FOREIGN PATENT DOCUMENTS

TW  M352748  3/2009

(Continued)

OTHER PUBLICATIONS

Design Registration No. 300503920.0000 [Korea], filed on Jul. 22, 2008, registered on Aug. 25, 2008 (3 pages).

(Continued)

*Primary Examiner* — Chandrika Prasad
(74) *Attorney, Agent, or Firm* — McCarter & English, LLP

(57) ABSTRACT

A computer peripheral device is provided having a rotatable outer cover which is coupled to and selectively extends or retracts a connector of a printed circuit from a casing in which the printed circuit board is positioned when the outer cover is rotated. In one aspect, the cover includes a pin which extends through a groove formed in a seat coupled to an end of the circuit board. When the cover is rotated, the pin is urged against the groove to selectively extend or retract the connector from the casing. In another aspect, the cover includes a pin which extends into a groove formed in the printed circuit board. When the cover is rotated, the pin is urged against the groove to selectively extend or retract the connector from the casing. In another aspect, the cover is pivotally interconnected with the circuit board, and when the cover is rotated, the casing selectively translates with respect to the circuit board to expose or cover the connector.

18 Claims, 8 Drawing Sheets

U.S. PATENT DOCUMENTS

| | | | |
|---|---|---|---|
| D607,433 S | 1/2010 | Drori et al. | |
| D610,157 S | 2/2010 | Ma | |
| 7,749,001 B2* | 7/2010 | Ma | 439/131 |
| 2003/0223286 A1* | 12/2003 | Lee | 365/200 |
| 2004/0145875 A1* | 7/2004 | Yu et al. | 361/752 |
| 2008/0094807 A1 | 4/2008 | Hiew et al. | |
| 2008/0288697 A1 | 11/2008 | Kim | |
| 2009/0227144 A1* | 9/2009 | Ma | 439/620.15 |
| 2010/0075517 A1 | 3/2010 | Ni et al. | |

FOREIGN PATENT DOCUMENTS

TW      M368821      11/2009

OTHER PUBLICATIONS

Design Registration No. 300500238.0000 [Korea], filed on Nov. 28, 2007, registered on Jul. 23, 2008 (2 pages).

Design Registration No. 300414236.0000 [Korea], filed on Jul. 28, 2005, registered on May 8, 2006 (2 pages).

10 Stupid and/or Cool USB Flash Drives: EveryJoe-Sports News-Tech Reviews-Entertainment-Life Tips for EveryJoe, [online] posted on Nov. 2, 2009 [retrieved on Nov. 2, 2009]. Retrieved from the Internet <URL: http://www.everyjoe.com/articles/10-stupid-andor-cool-usb-flash-drives/> (11 pages).

U.S. Appl. No. 29/311,792, entitled: "Flash Drive," filed Jun. 24, 2009 (9 pages).

U.S. Appl. No. 29/311,791, entitled: "Flash Drive," filed Jun. 24, 2009 (8 pages).

Notice of Allowance dated May 29, 2010 from U.S. Appl. No. 29/311,792 (6 pages).

Notice of Allowance dated May 29, 2010 from U.S. Appl. No. 29/311,791 (6 pages).

Taiwan Patent Application No. 98302639, entitled: "Flash Drive," filed on Jun. 10, 2009 (15 pages).

Taiwan Patent Application No. 98302640, entitled: "Flash Drive," filed on Jun. 10, 2009 (15 pages).

Chinese Patent Application No. 200920156532.9, entitled: "Computer Peripheral Device," filed on Jun. 22, 2009 (with English Translation) (42 pages).

Chinese Patent Application No. 200930187733.0, entitled: "Flash Drive," filed on Jun. 24, 2009 (10 pages).

Chinese Patent Application No. 200930181478.9, entitled: "Flash Drive," filed on Jun. 18, 2009 (6 pages).

Notification of Correction issued on Nov. 25, 2009, from the State Intellectual Property Office in connection with Chinese Application No. 2009301877330 (1 page).

* cited by examiner

COMPUTER PERIPHERAL DEVICE WITH A PIN EXERTING A FORCE TO EXTEND OR RETRACT A CONNECTOR

RELATED APPLICATIONS

This application claims priority to Taiwanese Patent Application No. 098209389 (now Taiwanese Patent No. M368821), filed May 27, 2009, and Chinese Patent Application No. 200920156532.9, filed Jun. 1, 2009, the entire contents of which are both expressly incorporated herein by reference.

BACKGROUND OF THE INVENTION

1. Field of the Invention

The present invention relates to a computer peripheral device. More specifically, the present invention relates to a computer peripheral device having a rotatable outer cover which is coupled to and selectively extends or retracts the peripheral device from a casing, when the outer cover is rotated.

2. Related Art

As the microcomputer industry is constantly refined towards perfection, and with the rapid growth of telecommunications networks, users have an increasing demand for accessing and controlling data flow among microcomputer devices (e.g., personal computers, digital cameras, and personal data assistant devices), giving rise to a variety of computer peripheral devices (e.g., flash drives, Bluetooth® transceivers, pocket hardware, etc.). Of the various peripheral devices, devices with a Universal Serial Bus (USB) port are popular because they allow for the device to be quickly inserted or removed from a computer. In addition, the capacity of peripheral device memory has been increasing rapidly, allowing for computer peripheral device users to store increasingly larger amounts of data on these devices. As a result, peripheral devices having a USB port have become indispensable and invaluable among users.

One such commonly used peripheral device is a flash drive. A traditional flash drive is fitted with a removable cap. When a user wishes to use the flash drive, they must remove the cap from the flash drive body, allowing the flash drive USB plug to be inserted in to a corresponding computer jack. Due to the small size of the cap, it is very easy for a user to inadvertently lose the cap during the course of use. When the cap is lost, users are inconvenienced by having to find a matching cap to replace the lost cap. In addition, when the cap is lost, the USB plug is exposed, often resulting in the plug being damaged or deformed. A damaged or deformed USB plug is often incapable of being inserted into a computer jack, giving rise to unnecessary distress and inconvenience.

To solve the aforementioned problems, a rotatable computer peripheral device has been developed, as illustrated in FIG. 1. The prior art computer peripheral device comprises a casing 10, a circuit board 11 and a cover 12. The casing 10 has an opening 101 at one end and an accommodation space 102 inside. The circuit board 11 is housed inside the accommodation space 102. The circuit board 11 has a connector 111 adjacent to the opening 101 to the casing 10. The cover 12 is generally in a U-shape, with two walls running parallel to each other and extending to form a free end. The casing 10 is pivotally connected to the cover 12, such that the casing 10 can be rotated and retained inside the cover 12, or can be rotated out of the cover 12. The problem of losing the outer cover is solved with this construction. However, because both sides of the cover 12 are open, the connector 111 cannot be fully shielded when the casing 10 is housed in the cover 12. As a result, the casing 10 may be easily contaminated by outside dust and foreign objects, resulting in damage to the connector 111 of the circuit board 11.

SUMMARY OF THE INVENTION

The present invention relates to a computer peripheral device having a rotatable outer cover which is pivotally coupled to a casing and selectively retracts or extends a connector (terminal) of a circuit board from the casing when the outer cover is rotated.

A computer peripheral device is provided, which includes a cover, a casing, and a device (e.g., a USB flash drive). The device includes a circuit board, a connector, and a guide rail. The connector is in electrical communication with a circuit board so that when plugged into a computer jack the device can transmit or receive data. The cover, casing, and device are assembled so that the casing can be rotated to expose the connector of the device and to extend the connector from the casing. Once exposed, the terminal of the device can be plugged into a computer jack. After use, it can be retracted into the casing by rotating the outer cover, to prevent it from being bumped or damaged.

In one aspect, the casing has an opening at one end, and a first accommodation space adjacent to the opening to house the device. This allows the connector of the device to be exposed outside the casing or retracted into the casing through the opening. The casing contains an aperture, while the cover contains a projection, which is received by the aperture, and a top push unit (pin). The projection is connected and aligned with the aperture so that the casing can be rotated around the central axis of the projection. The cover contains a second accommodation space wherein the casing can be positioned. The casing opening and the connector are shielded by the cover when the casing opening is positioned inside the second accommodation space and is aligned with the cover end. The pin extends through the cover and rests against the device. When a user rotates the casing to remove it from the second accommodation space, the pin exerts a force on the device to extend the connector from the first accommodation space. When the distance between the casing opening and the end of the cover is maximized (i.e., when the cover is rotated 180 degrees from its closed position), the connector is completely exposed outside the casing and the cover. As such, a user can simply rotate the cover to quickly put the computer peripheral device in a condition for use. Since there is no independent outer cover, users are free from worrying about losing the cover and any problems flowing therefrom.

In another aspect, the printed circuit board of the computer peripheral device of the present invention includes a groove on the circuit board, positioned opposite the connector. A guide rail is located inside the groove with the pin extending through the casing and the cover to engage the groove. When a user turns the casing to rotate the opening towards the second accommodation space, the pin pushes the connector towards the first accommodation space. When the distance between the opening and the end of the cover is minimized (i.e., when the cover is in its closed position), the connector is completely retracted into the casing. This allows a user to retract the connector as soon as he/she is finished using the device, thus preventing the connector from being bumped or deformed, or being contaminated by foreign objects.

In still another aspect, the computer peripheral device of the present invention includes a cover, casing, and a printed circuit board. The cover forms a first accommodation space and contains a projection and a pin. The casing is housed in the first accommodation space and forms a second accommodation space which houses the circuit board. The casing further includes an arc-shaped groove which is engaged by the pin. The circuit board includes an aperture which is received by the projection, causing the circuit board and the cover to be pivotally connected. When a user rotates the cover, the pin exerts a force on the casing, pushing the casing away from the circuit board and exposing the connector. When the connector is fully exposed, the casing is housed inside the cover.

BRIEF DESCRIPTION OF THE DRAWINGS

The foregoing features of the invention will be apparent from the following Detailed Description of the Invention, taken in connection with the accompanying drawings, in which.

DETAILED DESCRIPTION OF THE INVENTION

Figure 1:
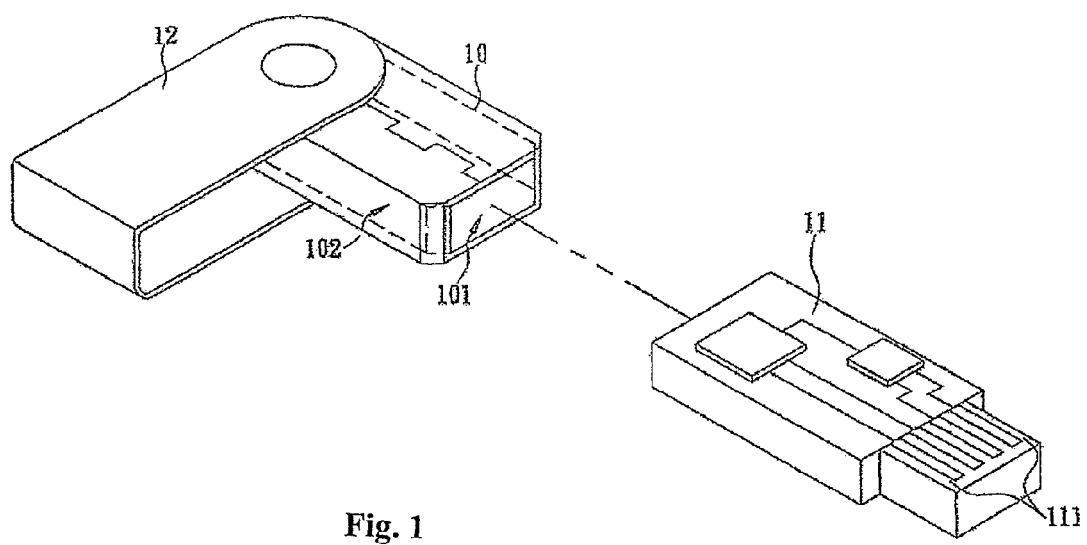
FIG. 1 is a perspective view of a prior art computer peripheral device.
Figure 2:
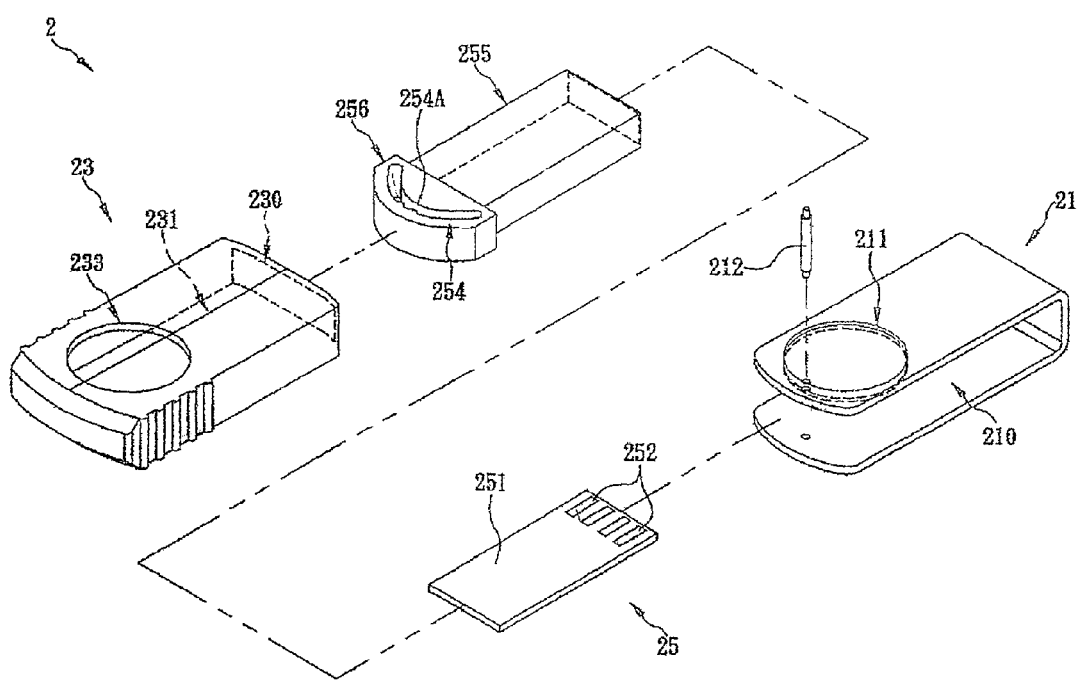
FIG. 2 is an exploded view showing one aspect of the present invention.
Figure 3:
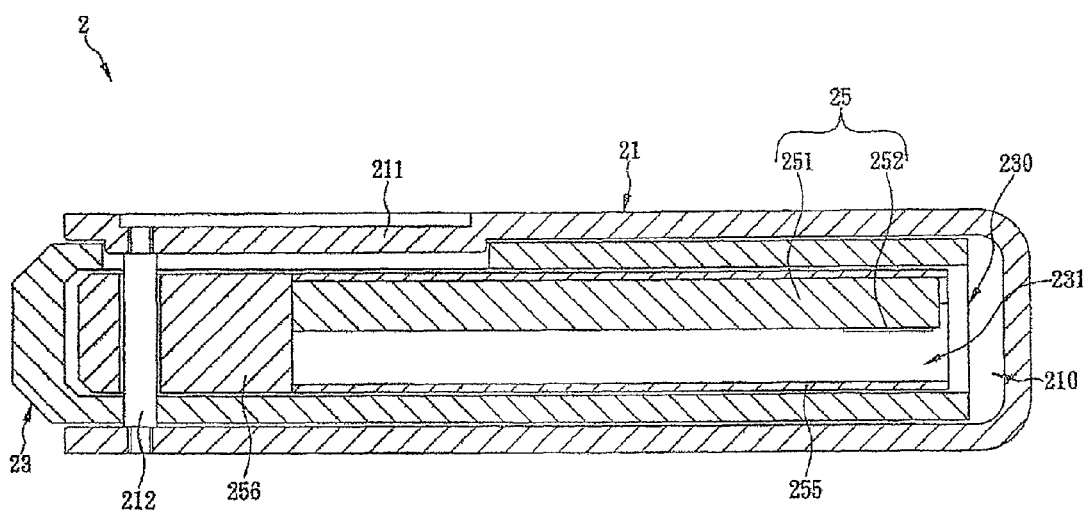
FIG. 3 is a cross-sectional view taken along the longitudinal axis of the apparatus of FIG. 2.

FIG. 2 and FIG. 3 show one aspect of the present invention, indicated generally at 2. The computer peripheral device 2 comprises a cover 21, a casing 23 and a peripheral device 25. The cover 21 may be made of a bent metal piece, generally in the shape of a U, forming a first accommodation space 210. The cover further includes a first pivotally connected portion (projection) 211 and a top push unit (pin) 212. The pin 212 is positioned adjacent to the projection 211, with the rotational axies of the projection 211 and the pin 212 being parallel, and separate. The casing 23 forms a second accommodation space 231 which is accessable by an opening 230 located at one end of the casing 23. The casing 23 also contains a second pivotally connected portion (aperture) 233 which receives the projection 211. When the aperture 233 is connected with the projection 211, the casing 23 is able to rotate about the central axis of the projection 211, and subsequently in to or out of the first accommodation space 210. When the opening 230 is rotated into the first accommodation space 210, and is adjacent to the rear wall of the cover 21, the opening 230 is shielded by the cover 21. This arrangement protects the interior of the casing 23 by restricting foreign objects (e.g., hair, rocks, dust, etc.) from entering the opening 230. In other embodiments of the present invention, the cover may be made of plastic or other materials. Further, the casing may be formed from a single material through molding processes or can be assembled from separate upper and lower components.

As shown in FIG. 2 and FIG. 3, the peripheral device 25 of the present invention contains a circuit board 251 and a connector 252. The circuit board 251 may be a printed circuit board (PCB), a circuit made by chip on board (COB), or any other viable alternative. The connector 252, composed of several pins, is positioned at one end of the circuit board 252 and is in electrical communication with the circuitry of the circuit board 251. When the connector 252 is plugged into a computer jack, the corresponding computer will immediately recognize the device and be able to execute the desired tasks (e.g., reading, writing data, encrypting, decoding, etc.). The peripheral device 25 is stored in the second accommodation space 231 of the casing 23, while the connector 252 can be extended out from or retracted in to the casing 23 through the opening 230. Further, the pin 212 extends through the casing 23 to rest against the guide rail 254A, allowing the pin 212 to move along the guide rail 254A according to the guide rail shape, selectively forcing the peripheral device in a direction. The device 25 also includes a protective shield 255 and a seat 256.

The protective shield 255 is a hollow frame which holds the peripheral device 25 inside, increasing the overall durability. The protective shield 255 acts as a security measure by preventing a user from incorrectly inserting the computer peripheral device 2 into a computer jack. The seat 256, located at the end of the circuit board 251, is connected with the protective shield 255 for added stability and to prevent the protective shield 255 from being removed. The seat 256 contains a groove 254, which includes the guide rail 254A. The groove 254 is generally in the shape of an arc, and could have a 12 mm straight line distance from end to end. The pin 212 extends through the casing 23 to engage the groove 254 and rest against the guide rail 254A.

Figure 4A:
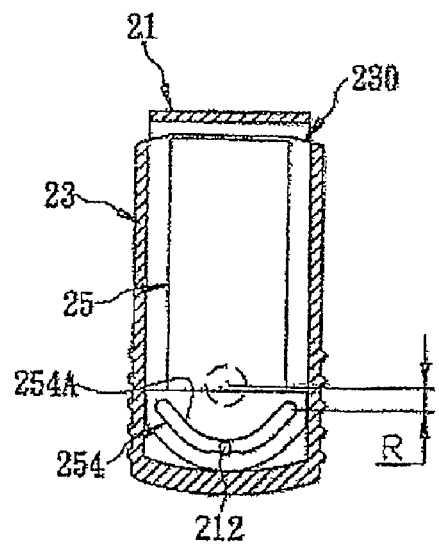
FIGS. 4A-4C are cross-sectional views showing operation of the apparatus of FIG. 2.
Figure 4B:
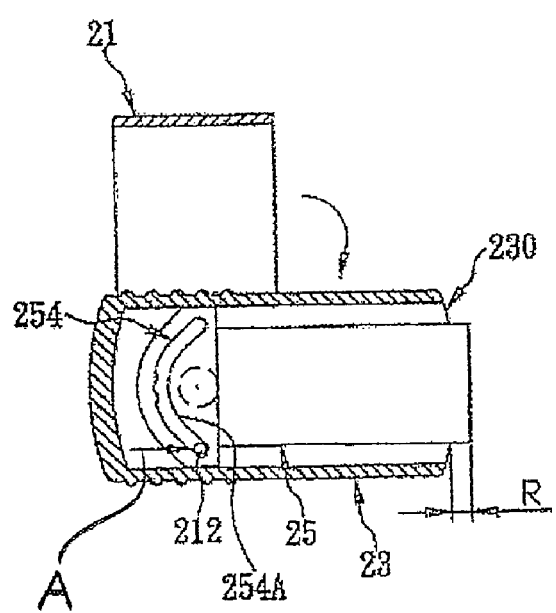
Figure 4C:
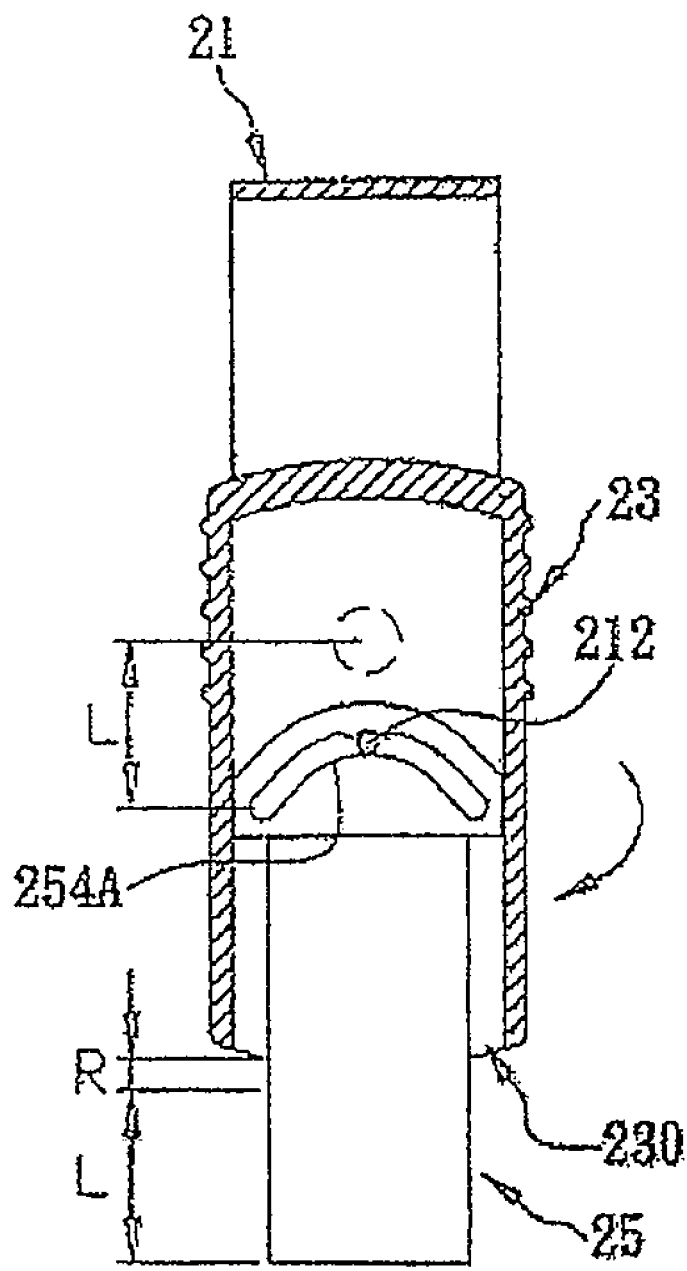

FIGS. 4A-4C are cross-sectional views of the apparatus of the present invention. To clearly illustrate the apparatus, a section side of the cover is not shown. The dashed circle in FIGS. 4A-4C indicate the axis of rotation of the projection 211 and the aperture 233. During operation, a user holds the cover 21 of the computer peripheral device 2 and rotates the casing 23 out from the first accommodation space 210. While the casing 23 is rotated out from the first accommodation space 210, it simultaneously forces the device 25 to rotate. During this rotation, the pin 212 moves along the groove 254, and exerts a force onto the guide rail 254A (as illustrated by the arrow A in FIG. 4B), urging the connector 252 out from the second accommodation space 231.

The distance traversed by the connector 252 is the distance from the axis of rotation of the projection 211 shown in FIG. 4A to the end of the groove 254, i.e., length R. When the distance between the opening 230 and the cover end 21 is maximized (i.e., the casing 23 is completely removed from the first accommodation space 210, and the connector 252 is fully extended), the distance traversed by the connector 252 is the length between the pivotal axis in FIG. 4C and the end of the gliding groove 254, length L. Therefore, when the connector 252 is fully extended the total distance traversed is R+L. At this point, the connector 252 is completely exposed outside the casing 23 and the cover 21. A user can then plug the computer peripheral device 2 into a computer jack. When a user is finished using the computer peripheral device 2, he/she can again rotate the casing 23 and the cover 21 to move the opening 230 towards the first accommodation space 210. During this rotation, the pin 212 exerts a force onto the groove 254 driving the connector 252 towards the second accommodation space 231. When the distance between the opening 230 and the end of the cover 21 is minimized (i.e., the casing 23 is completely inside the first accommodation space 210), the connector 252 is secured and completely retracted into the casing 23. Therefore, when users are finished using the computer peripheral device 2, they do not have to worry about covering the device with an independent cap. Further, a user can quickly retract the connector 252, making the device very convenient.

Figure 5:
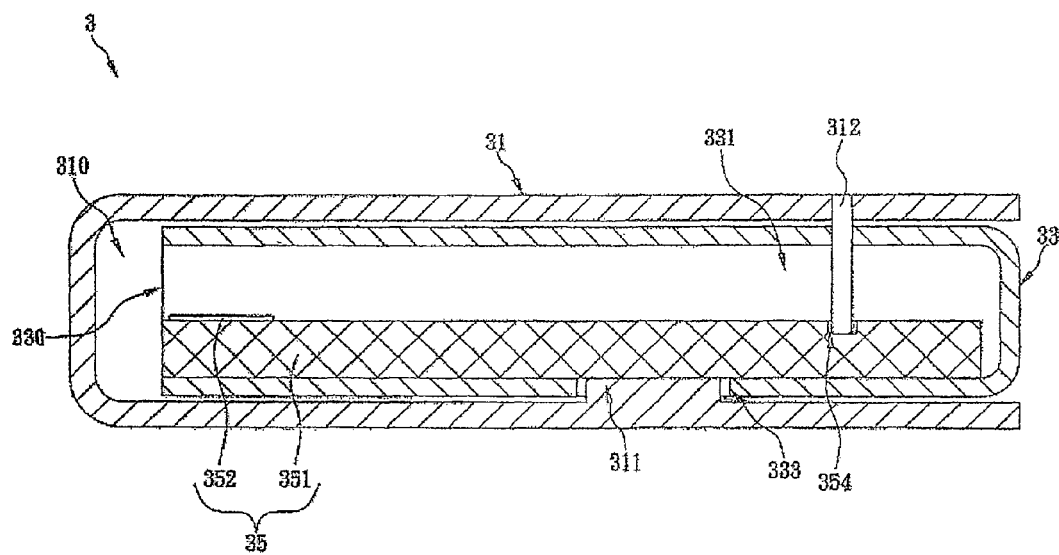
FIG. 5 is a cross-sectional view showing another aspect of the present invention.

FIG. 5 shows a cross-sectional view of another aspect of the present invention. The computer peripheral device 3 includes a cover 31, a casing 33 and a peripheral device 35.

The cover 31 contains a first accommodation space 310, a projection 311, and a pin 312. The casing 33 includes an opening 330, which accesses a second accommodation space 331 formed by the casing, and an aperture 333. The projection 311 can be received by the aperture 333, creating a pivotal connection between the cover 31 and the casing 33. This pivotal connection allows the casing 33 to rotate around the central axis of the projection 311. Further, the peripheral device 35 includes a circuit board 351 and a connector 352 at one end of the circuit board 351. In this aspect, a manufacturer may choose to exclude the protective shield and the seat of FIGS. 2-4C to lower manufacturing costs and shorten the assembly process. Instead, a groove 354, containing a guide rail, may be included on the end of the circuit board 351, opposite the connector 352. The pin 312 extends through the casing 33 and into the groove 354, where it rests against the guide rail. When a user turns the casing 33, the pin 312 pushes against the guide rail, forcing the connector 352 to extend out from the casing 33 or retract in to the casing 33.

Figure 6A:
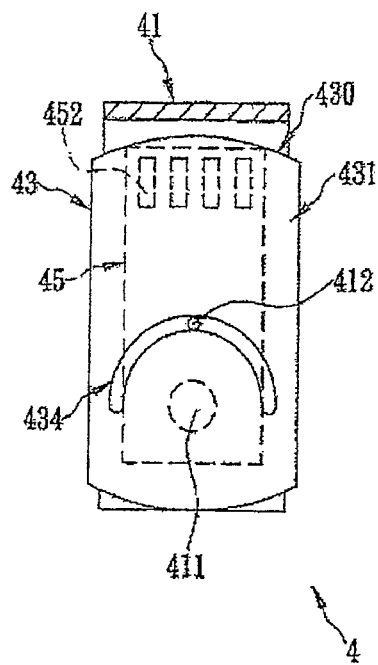
FIGS. 6A-6C are cross-sectional views showing another aspect of the present invention.
Figure 6B:
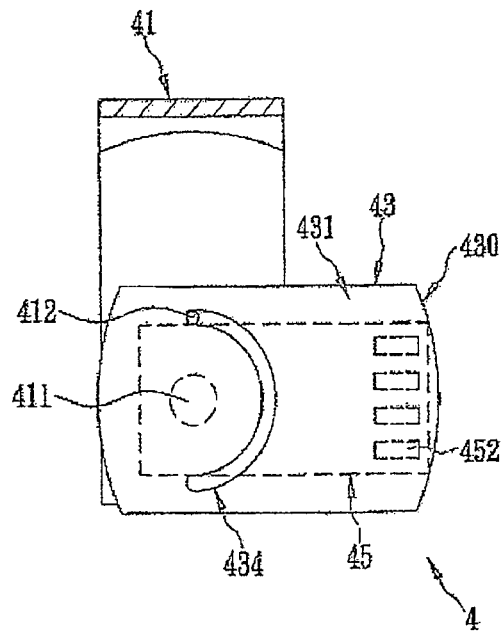
Figure 6C:
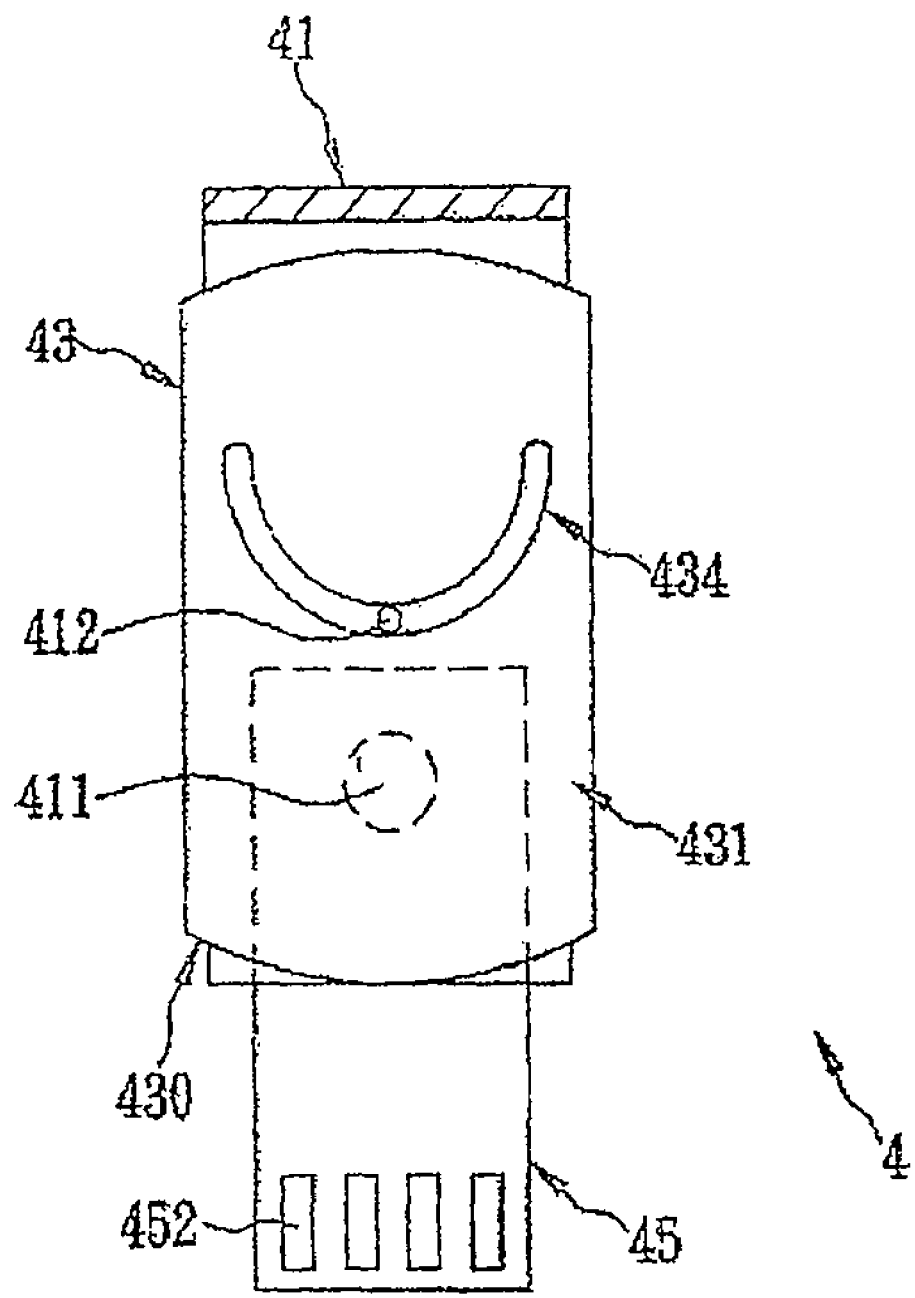

FIGS. 6A-6C are cross-sectional views showing another aspect of the present invention. As shown in FIG. 6A, the computer peripheral device 4 includes a cover 41, a casing 43 and a peripheral device 45. The cover 41 contains a first accommodation space 430, a projection 411, and a pin 412. The central axes of the projection 411 and the pin 412 are parallel and spaced apart. The casing 43, which is housed in the cover 41, includes an opening 430 at one end, accessing a second accommodation space 431, and an arc-shaped groove 434 on one side, through which the pin 412 extends. The peripheral device 45 is housed inside the second accommodation space 431 and contains an aperture (not shown), which receives the projection 411. Then, as shown in FIG. 6B, when the aperture is received by the projection 411, the peripheral device 45 can rotate about the central axis of the projection 411. When a user rotates the casing 43, and subsequently the peripheral device, the opening 430 rotates out from the first accommodation space. The pin 412 exerts a force on to the groove 434, pushing the casing 43 away from the peripheral device 45 and exposing the connector 452, as shown in FIG. 6C. The casing 43 is housed inside the cover 41 when the connector 452 of the device 45 is completely exposed.

The casing of the present invention may contain only one side contacting the peripheral device, while the second side can be omitted to reduce manufacturing cost. The shape and/or the length of the groove can be altered according to different design models and styles, without departing from the scope of the present invention. For example, the device manufacturers can change the ½ arc-shaped groove illustrated in FIG. 2 into ¼ arc-shaped groove. The design of the aperture on the casing can also be altered. An aperture and a groove may be included on the casing to allow the projection and the pin to pass through, instead of having the projection as presented in the present invention. Also, instead of providing a groove on the circuit board or on the seat, the device manufacturer can install a guide rail for the pin to rest against. In such a configuration, when a user rotates the casing and the cover, the pin exerts a force onto one end of the circuit board or the seat to push the connector outside the casing and the cover. When a user wants to retract the connector, he/she can hold the computer peripheral device vertical, and rotate the casing and the cover to retract the connector into the casing by the force of gravity.

This description includes several improved embodiments of the present invention. However, the claims for the present invention are not restricted to this recitation. From the technical content published with the present invention, computer peripheral device designers and manufacturers may come up with other equally effective model variations. These variations would fall into the protective scope of the present invention.

Having thus described the invention in detail, it is to be understood that the foregoing description is not intended to limit the spirit or scope thereof. What is desired to be protected is set forth in the following claims.

What is claimed is:
1. A computer peripheral device, comprising:
a casing housing a circuit board having a connector at one end;
a cover pivotally interconnected with the casing, the cover defining an accommodation space in which at least part of the exterior of the casing is positioned; and
a pin pivotally coupled to the circuit board and connected to the cover,
wherein when the cover is rotated with respect to the casing, the pin exerts force against the circuit board to selectively extend or retract the connector from the casing.
2. The computer peripheral device of claim 1, further comprising a seat having a groove and connected with an end of the circuit board.
3. The computer peripheral device of claim 2, further comprising a shield housing the circuit board, the shield connected at one end to the seat.
4. The computer peripheral device of claim 2, further comprising a guide rail inside the groove.
5. The computer peripheral device of claim 2, wherein the pin extends through the groove.
6. The computer peripheral device of claim 2, wherein the groove is in the shape of an arc.
7. The computer peripheral device of claim 1, further comprising a groove on the circuit board.
8. The computer peripheral device of claim 7, wherein one end of the pin engages the groove.
9. The computer peripheral device of claim 1, wherein the pin is positioned adjacent to an interconnection between the casing and cover.
10. The computer peripheral device of claim 1, wherein the cover is metal.
11. The computer peripheral device of claim 1, wherein the cover has a U shape.
12. A computer peripheral device, comprising:
a casing housing a circuit board having a connector at one end;
a cover pivotally interconnected with the circuit board, the cover defining an accommodation space in which at least part of the exterior of the casing is positioned; and
a pin pivotally coupled to the casing and connected to the cover,
wherein when the casing is rotated with respect to the cover, the pin exerts a force against the casing to selectively translate the casing with respect to the circuit board to expose or cover the connector.
13. The computer peripheral device of claim 12, further comprising a groove on the casing.
14. The computer peripheral device of claim 13, further comprising a guide rail inside the groove.
15. The computer peripheral device of claim 13, wherein the groove is in the shape of an arc.
16. The computer peripheral device of claim 14, wherein the pin extends through the groove.
17. The computer peripheral device of claim 12, wherein the cover is metal.
18. The computer peripheral device of claim 12, wherein the cover has a U shape.

* * * * *

UNITED STATES PATENT AND TRADEMARK OFFICE
CERTIFICATE OF CORRECTION

PATENT NO. : 8,246,362 B2  
APPLICATION NO. : 12/788452  
DATED : August 21, 2012  
INVENTOR(S) : Tien-Chi Ma Page 1 of 1

It is certified that error appears in the above-identified patent and that said Letters Patent is hereby corrected as shown below:

On the Title page of the patent, under "Foreign Application Priority Data", "2009 2 015632 U" should be --2009 2 015632.9 U--.

Signed and Sealed this  
First Day of January, 2013

David J. Kappos  
*Director of the United States Patent and Trademark Office*